(12) United States Patent
Cavallaro et al.

(10) Patent No.: US 9,456,529 B2
(45) Date of Patent: Sep. 27, 2016

(54) HEAT MANAGEMENT STRUCTURE FOR A WEARABLE ELECTRONIC DEVICE AND METHOD FOR MANUFACTURING SAME

(71) Applicant: Google Technology Holdings LLC, Mountain View, CA (US)

(72) Inventors: Alberto R. Cavallaro, Northbrook, IL (US); Martin R. Pais, North Barrington, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 135 days.

(21) Appl. No.: 14/337,309

(22) Filed: Jul. 22, 2014

(65) Prior Publication Data

US 2015/0359135 A1 Dec. 10, 2015

Related U.S. Application Data

(60) Provisional application No. 62/008,807, filed on Jun. 6, 2014.

(51) Int. Cl.
*H05K 7/20* (2006.01)
*G06F 1/20* (2006.01)
*B23P 15/26* (2006.01)

(52) U.S. Cl.
CPC ............ *H05K 7/2039* (2013.01); *B23P 15/26* (2013.01); *G06F 1/203* (2013.01); *Y10T 29/49352* (2015.01)

(58) Field of Classification Search
CPC ........ H05K 7/20; H05K 7/2039; G06F 1/20; G06F 1/203; H01L 23/36; H01L 35/02; G04C 10/00; G04C 10/10
USPC ............ 361/679.46, 679.54, 679.55, 679.01, 361/679.03, 704–712, 714, 715, 719–722; 165/80.2, 104.33, 185; 257/706–718; 136/201, 205, 242; 368/203, 204
See application file for complete search history.

(56) References Cited

U.S. PATENT DOCUMENTS

| | | | | |
|---|---|---|---|---|
| 5,970,718 A | * | 10/1999 | Arnold .................. | A61F 7/10 607/109 |
| 6,359,841 B1 | * | 3/2002 | Kotanagi .............. | G04C 10/00 136/205 |
| 6,407,965 B1 | * | 6/2002 | Matoge ................. | G04C 10/00 136/205 |
| 6,426,921 B1 | * | 7/2002 | Mitamura ............. | G04C 10/00 136/205 |

(Continued)

FOREIGN PATENT DOCUMENTS

JP 02013197230 A * 9/2013 ............. H01L 23/36

OTHER PUBLICATIONS

Darren Quick: "Wristify thermoelectric bracelet makes heating and cooling personal", http://www.gizmag.com/wristify-thermoelectric-bracelet/29543, Oct. 24, 2013, all pages.

*Primary Examiner* — Michail V Datskovskiy
(74) *Attorney, Agent, or Firm* — Faegre Baker Daniels LLP

(57) ABSTRACT

A heat management structure for a wearable electronic device includes a first thermally conductive layer, a second thermally conductive layer, and insulating layer. The first and second thermally conductive layers and the insulating layer are arranged in a stacked configuration along their surface areas with the insulating layer disposed between and in physical contact with the first and second thermally conductive layers. At least one edge of the second thermally conductive layer extends beyond an edge of at least one of the first thermally conductive layer or the insulating layer.

19 Claims, 4 Drawing Sheets

(56) References Cited

U.S. PATENT DOCUMENTS

| | | | |
|---|---|---|---|
| 6,831,359 B2 * | 12/2004 | Heilbronner | B82Y 10/00 257/706 |
| 6,970,399 B2 * | 11/2005 | Watanabe | G04C 10/00 368/204 |
| 7,066,244 B2 * | 6/2006 | Chen | H01L 23/36 165/185 |
| 7,161,809 B2 | 1/2007 | Ford et al. | |
| 7,286,360 B2 * | 10/2007 | Sohn | H01L 23/3672 257/E23.103 |
| 7,292,441 B2 | 11/2007 | Smalc et al. | |
| 2005/0270746 A1 * | 12/2005 | Reis | G06F 1/203 361/708 |
| 2008/0101026 A1 * | 5/2008 | Ali | G06F 1/203 361/708 |
| 2008/0141681 A1 * | 6/2008 | Arnold | A41D 13/005 62/3.5 |
| 2010/0198322 A1 * | 8/2010 | Joseph | A61F 7/007 607/108 |
| 2012/0194976 A1 * | 8/2012 | Golko | G06F 1/163 361/679.01 |
| 2014/0009891 A1 * | 1/2014 | Chen | H05K 7/20436 361/720 |
| 2014/0198438 A1 * | 7/2014 | Aurongzeb | G06F 1/20 361/679.02 |
| 2014/0299169 A1 * | 10/2014 | Schneider | H01L 35/02 136/201 |

* cited by examiner

HEAT MANAGEMENT STRUCTURE FOR A WEARABLE ELECTRONIC DEVICE AND METHOD FOR MANUFACTURING SAME

RELATED APPLICATIONS

The present application is related to and claims benefit under 35 U.S.C. §119(e) from U.S. Provisional Patent Application Ser. No. 62/008,807 filed Jun. 6, 2014, the entire contents of which is being incorporated herein by reference.

FIELD OF THE DISCLOSURE

The present disclosure relates generally to managing heat generated by an electronic device and more particularly to a structure for managing heat generated by a wearable electronic device.

BACKGROUND

Wearable electronic devices, such as watches, are incorporating more active features including sensors, higher speed processors, and larger displays, which are expected to dissipate increased amounts of heat. The heat transfer path for cooling the wearable devices is partly, and unintentionally, to the wearer's skin, which can create discomfort even under modest heat load conditions, if not properly managed. Known heat-spreading mechanisms for electronic devices focus on keeping the internal electronics at an acceptable operating temperature but are not optimized for keeping a user's skin cool when the electronic device is a wearable electronic device.

BRIEF DESCRIPTION OF THE FIGURES

The accompanying figures, together with the detailed description below, are incorporated in and form part of the specification. The figures serve to further illustrate embodiments of concepts that include the claimed embodiments and explain various principles and advantages of those embodiments. Like reference numerals refer to identical or functionally similar elements throughout the separate views of the figures.

Figure 1:
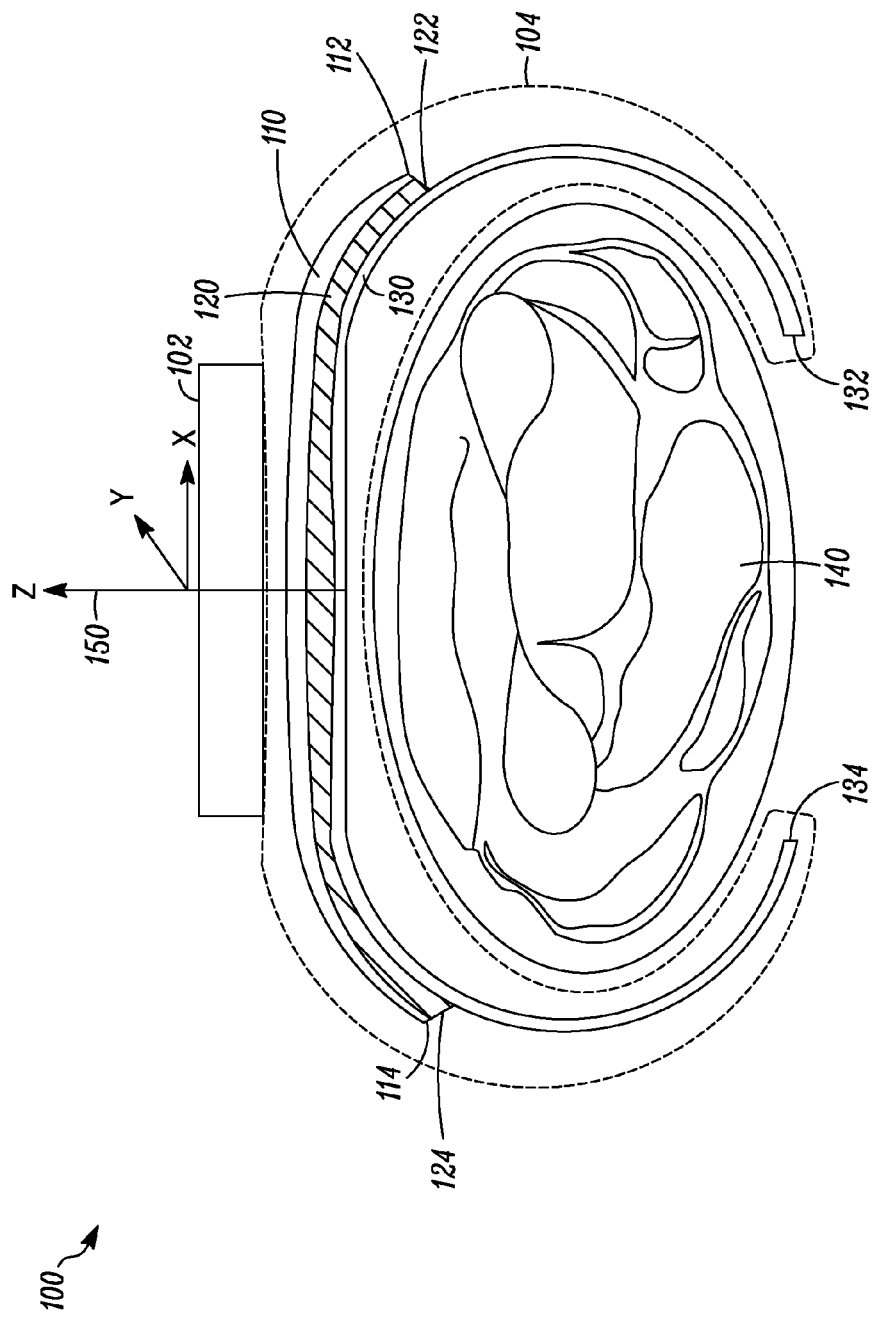
FIG. 1 is a schematic diagram illustrating a cross-sectional view of a heat management structure for a wearable electronic device in accordance with an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure. The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

Generally speaking, pursuant to some embodiments, a heat management structure includes a first thermally conductive layer, a second thermally conductive layer, and an insulating layer. The first and second thermally conductive layers and the insulating layer are arranged in a stacked configuration along their surface areas with the insulating layer disposed between and in physical contact with the first and second thermally conductive layers. In accordance with one or more embodiments, at least one edge of the second thermally conductive layer extends beyond an edge of at least one of the first thermally conductive layer or the insulating layer.

In accordance with another embodiment, a wearable electronic device includes a portable electronic device and a heat management structure coupled to the portable electronic device. The heat management structure includes a first thermally conductive layer disposed adjacent to the portable electronic device. The heat management structure further includes a second thermally conductive layer and an insulating layer disposed between and in physical contact with the first and second thermally conductive layers. The first and second thermally conductive layers and the insulating layer are arranged in a stacked configuration along their surface areas.

In accordance with yet another embodiment, a method for manufacturing a heat management structure includes disposing a first thermally conductive layer onto a first side of an insulating layer and disposing a second thermally conductive layer onto a second side of the insulating layer. The first and second thermally conductive layers and the insulating layer are arranged in a stacked configuration along their surface areas. Moreover, in at least one arrangement, at least one edge of the second thermally conductive layer extends beyond an edge of one or both of the first thermally conductive layer or the insulating layer.

At least one benefit of the heat management structure of the present disclosure is its dual-purpose heat management mechanism. Particularly, the heat management structure provides a path for heat away from the portable electronic device to which the structure is coupled and also provides a path for heat away from the skin of a person wearing the portable electronic device. The path for the heat away from the wearer's skin is provided through a region of the thermally conductive layer that is both adjacent to the skin and adjacent to the atmosphere.

Referring now to the drawings, and in particular FIG. 1, which shows a schematic diagram illustrating a cross-sectional view of a heat management structure for a wearable electronic device in accordance with some embodiments. Particularly, FIG. 1 illustratively shows a wearable electronic device 100 that includes a portable electronic device 102 attached to a wearable element 104. The wearable element 104 is configured to be worn on a body part. Thus, a wearable electronic device, as used herein, refers to any electronic device having attached thereto a mechanism that enables a user to "wear" or otherwise carry a portable electronic device on his or her body.

As shown, the portable electronic device 102 can be a watch or watch-like device such as a wrist-worn computer; and the wearable element 104 is, accordingly, a wristband. However, the specifics of this example are merely illustrative of some embodiments, and the teachings set forth herein are applicable in a variety of alternative settings. For example, the teachings are not limited to the particular wearable electronic devices shown in the drawings but can be applied to any type of wearable electronic device. As such, alternative implementations embodying different types of wearable electronic devices are contemplated and are within the scope of the various teachings described. Such wearable electronic devices include, but are not limited to, a portable electronic device such as a computer, a camera, a gaming device, a music or video player, or monitoring equipment for bodily functions or vitals, which is attached to: head wear such as an eyewear frame, a headband, or a cap or hat; wrist wear; a chest band; an armband; a leg band; an article of clothing; or any other type of strap, band, or garment.

Due to the circuitry inside of the portable electronic device 102, it can generate heat during operation and is, therefore, also referred to herein as a heat source. Unless the heat generated by the portable electronic device 102 is managed, it can be perceptible and even uncomfortable to a wearer of the device 100. Accordingly, the wearable electronic device 100 further includes a heat management structure in accordance with the present teachings. The heat management structure is disposed within and, thereby covered by, the wristband 104. This could be for aesthetic purposes, for instance. However in other embodiments, the wearable element only partially covers or encloses the heat management structure or provides no coverage or enclosure over the heat management structure, such as when the heat management structure is designed and formed with aesthetic markings, colorings, or other aesthetic features.

The heat management structure at a minimum includes a first thermally conductive layer 110, an insulating layer 120, and a second thermally conductive layer 130. The "first" thermally conductive layer refers herein to the thermally conductive layer that is closest to the heat source 102. Whereas, the "second" thermally conductive layer refers herein to the thermally conductive layer that is closest to the skin or the body part on which the device 100 is worn, which in this case is a wrist 140. A thermally conductive layer is defined as a layer or piece of material characterized by or having a thermal conductivity that facilitates the transfer of heat. In one particular embodiment, a thermally conductive layer is constructed from "highly" thermally conductive material characterized by a thermal conductivity of at least, i.e., equal to or greater than, 100 Watts/(meter*kelvin)(W/m*K), such as copper or aluminum. In another embodiment, the thermally conductive layer is constructed from a material characterized by a thermal conductivity of at least 1000 W/m*K, such as graphite, graphene, thin heat-pipe structures, high conductivity ceramics or metals, etc., or a combination of two or more of these or similar materials.

By contrast, an insulating layer is defined as a layer or piece of material characterized by or having a thermal conductivity that facilitates thermal insulation or the reduction or inhibiting of heat transference. In one particular embodiment, an insulating layer is constructed from a "low" thermally conductive material, for instance other than air, which is characterized by a thermal conductivity of no more than, i.e., equal to or less than, 1 W/m*K. Example insulating materials include, but are not limited to, plastic, foam, fabric, leather or leather-like material, etc., or a combination of two or more of these or similar materials.

As further shown in FIG. 1, the first 110 and second 130 thermally conductive layers and the insulating layer 120 are arranged in a stacked configuration along their surface areas. The surface areas are disposed along X and Y axes and are, thus, not completely visible in this cross-sectional view. As used herein, layers in a "stacked configuration" are positioned such that each layer completely lies within a different plane, from every other layer, along an axis through which the layers are stacked. Moreover, the layers in a stacked configuration are directly adjacent to and in direct physical contact with one another with no intervening component or material except for a bonding agent if one is used to hold the layers together.

Particularly, the layers 110, 120, and 130 are arranged in a stacked configuration along a Z axis through the thickness of the layers, with the surface area of each layer being positioned within a different X-Y plane along the Z axis. Thus, the thickness of the resulting heat management structure is equal to the thickness of the layers 110, 120, and 130 and any bonding agent between the layers. Additionally, the insulating layer 120 is disposed between and in direct physical contact with the first 110 and second 130 thermally conductive layers.

Furthermore, the heat management structure is constructed such that at least one edge of the second thermally conductive layer 130 extends beyond an edge of at least one of the first thermally conductive layer 110 or the insulating layer 120. An edge represents a region along the thickness of a layer where the top and bottom surfaces, faces, or sides of the layer terminate. For example, illustrated in the cross-sectional view of FIG. 1 are: opposing edges 112 and 114 of the first thermally conductive layer 110; opposing edges 122 and 124 of the insulating layer 120; and opposing edges 132 and 134 of the second thermally conductive layer 130.

In this particular arrangement, both edges of the second thermally conductive layer 130 extend beyond the corresponding edges of both the first thermally conductive layer 110 and the insulating layer 120. Accordingly, as shown in FIG. 1 the second thermally conductive layer 130 is configured to a shape of a body part, which in this example is a wrist. More specifically, the surface areas of the first thermally conductive layer 110 and the insulating layer 120 are substantially the same; and the surface area of the second thermally conductive layer 130 is larger than the surface areas of the first thermally conductive layer 110 and the insulating layer 120.

Moreover, a central portion of the surface areas of the first 110 and second 130 thermally conductive layers and the insulating layer 120 are aligned about a central axis or plane through the stacked configuration, in this case along the Z axis, wherein the central axis or plane is indicated at 150. A central portion is a point or line along the surface area of a layer that lies along or substantially lies along an axis down the center or substantially down the center of the layer, which is referred to herein as a center axis of the layer. Accordingly, the edge 132 of the second thermally conductive layer 130 extends beyond the edges 112 and 122, respectively of the first thermally conductive layer 110 and the insulating layer 120; and the edge 134 of the second thermally conductive layer 130 extends beyond the edges 114 and 124, respectively, of the first thermally conductive layer 110 and the insulating layer 120.

The arrangement of the heat management structure illustrated in FIG. 1 operates as follows. Disposing or forming the first thermally conductive layer 110 such that part of the layer 110 is adjacent to the heat source 102, allows heat generated therein to be transferred along the surface area of the first thermally conductive layer 110 away from the heat source 102 and toward the regions of the first thermally conductive layer 110 that are not adjacent to the heat source 102 but are adjacent to the atmosphere. As used herein, a thermally conductive layer or portion thereof is adjacent to the atmosphere (or a wearer's skin) when the layer or portion thereof has surface area that is separated from the atmosphere (or the wearer's skin) by at most material of a wearable element or aesthetic covering.

Since the insulating layer 120 is designed to block the transfer of heat along the Z axis, most if not all of the heat generated by the portable electronic device 102 is dissipated into the atmosphere surrounding the wearable electronic device 100 in order to cool the portable electronic device 102. Having the edges 122 and 124 of the insulating layer 120 coincident with the edges 112 and 114 of the first thermally conductive layer 110 maximizes the heat transfer in the X-Y plane across the surface of thermally conductive layer 110 and minimizes the heat transfer through the thickness of the heat management structure along the Z axis toward the wearer's skin.

Additionally, the second thermally conductive layer 130 is disposed or formed such that part of the layer 130 is adjacent to the wearer's skin. Such placement allows any heat from the heat source 102 that makes it through the insulating layer 120 and any heat generated by the wearer's body 140 as a consequence of part of the wearer's skin laying beneath the insulating layer 120, or otherwise, to be transferred along the surface area of the second thermally conductive layer 130 away from the wearer's skin and toward the regions of the second thermally conductive layer 130 that are not adjacent to the heat source 102 and the layers 110 and 120 but are adjacent to the atmosphere and to the wear's skin. In this manner, heat is transferred away from the wearer's skin and dissipated into the atmosphere surrounding the wearable electronic device 100 in order to cool the wearer's skin. The amount of cooling to the wearer's skin and the heat source is based at least in part on the materials used to construct the heat management structure and the configuration of the structure including, but not limited to, the size of the region(s) of the first 110 and second 120 thermally conductive layers that are adjacent to the atmosphere.

Figure 2:
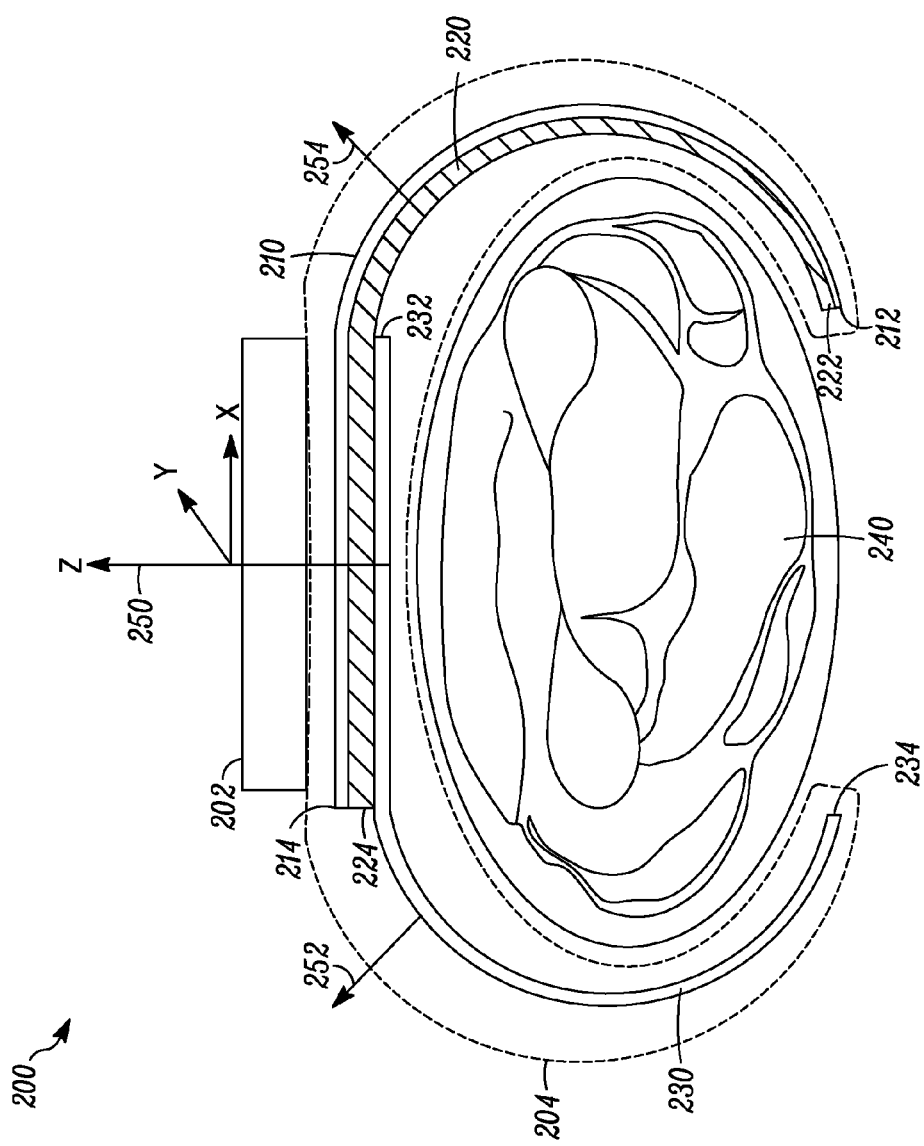
FIG. 2 is a schematic diagram illustrating a cross-sectional view of a heat management structure for a wearable electronic device in accordance with another embodiment.

FIG. 2 shows a schematic diagram illustrating a cross-sectional view of a heat management structure for a wearable electronic device in accordance with another embodiment. Particularly, FIG. 2 illustratively shows a wearable electronic device 200 that includes a portable electronic device 202 attached to a wearable element 204, which in this case is a wristband worn on a wrist 240 of a user. The wristband 204 includes a heat management structure having an alternative arrangement and configuration of the layers.

The heat management structure shown in FIG. 2 includes: a first thermally conductive layer 210 having edges 212 and 214 and a portion of which is disposed directly adjacent to the heat source 202; an insulating layer 220 having edges 222 and 224; and a second thermally conductive layer 230 disposed adjacent to the wearer's skin and having edges 232 and 234. The layers 210, 220, and 230 are arranged in a stacked configuration along a Z axis through the thickness of the layers, with the surface area of each layer being positioned within a different X-Y plane along the Z axis.

In this embodiment of the heat management structure, the surface areas of the first 210 and second 230 thermally conductive layers and the insulating layer 220 are substantially the same. Moreover, a central portion 254 of the surface areas of the first thermally conductive layer 210 and the insulating layer 220 are offset to one side of a central axis 250 through the stacked configuration; and a central portion 252 of the surface area of the second thermally conductive layer 230 is offset to an opposite side of the central axis 250 through the stacked configuration. Accordingly, only one edge 234 of the second thermally conductive layer 230 extends beyond edges 214 and 224, respectfully, of the first thermally conductive layer 210 and the insulating layer 220.

This arrangement of the heat management structure facilitates cooling of the heat source 202 through heat dissipation along the region of the surface area of the first thermally conductive layer 210 that is adjacent to the atmosphere, which in this case is the region of the surface area of the first thermally conductive layer 210 that is disposed between the edge 232 of the second thermally conductive layer 230 and the edges 212 and 222, respectively, of the first thermally conductive layer 210 and the insulating layer 220. This arrangement of the heat management structure also facilitates cooling of the wearer's skin beneath the heat source 202 through heat dissipation along the region of the surface area of the second thermally conductive layer 230 that is adjacent to the atmosphere, which in this case is the region of the surface area of the second thermally conductive layer 230 that is disposed between the edges 214 and 224, respectively, of the first thermally conductive layer 210 and the insulating layer 220 and the edge 234 of the second thermally conductive layer 230.

Figure 3:
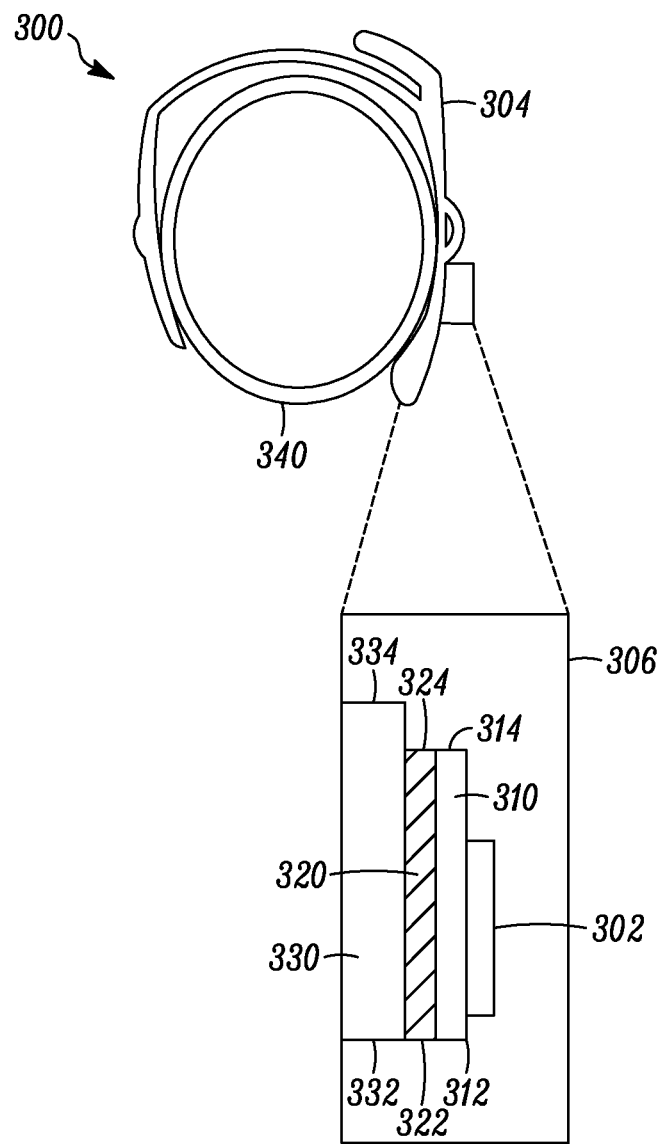
FIG. 3 is a schematic diagram illustrating a top-down view of a heat management structure for a wearable electronic device in accordance with yet another embodiment.

FIG. 3 shows a schematic diagram illustrating a top-down view of a heat management structure for a wearable electronic device in accordance with another embodiment. Particularly, FIG. 3 illustratively shows a wearable electronic device 300 that includes a portable electronic device 302 attached to a wearable element 304, which in this case is an eyewear frame worn on a head 340 of a user. The eyewear frame 304 includes a heat management structure, illustrated in a view 306, having an alternative arrangement and configuration of the layers. The heat management structure includes: a first thermally conductive layer 310 having edges 312 and 314 with a portion of which being disposed directly adjacent to the heat source 302; an insulating layer 320 having edges 322 and 324; and a second thermally conductive layer 330 having edges 332 and 334 and disposed adjacent to the wearer's skin. The layers 310, 320, and 330 are arranged in a stacked configuration along an axis through the thickness of the layers, with the surface area of each layer being positioned within a different plane along the axis through the thickness of the layers.

In this embodiment of the heat management structure, the surface areas of the first thermally conductive layer 310 and the insulating layer 320 are substantially the same, and the surface area of the second conductive layer 330 is larger than the surface areas of the first thermally conductive layer 310 and the insulating layer 320. Moreover, the edge 334 of the second thermally conductive layer 330 extends beyond the edges 314 and 324, respectfully, of the first thermally conductive layer 310 and the insulating layer 320; and the edge 332 of the second thermally conductive layer 330 is coincident with the edges 312 and 322, respectfully, of the first thermally conductive layer 310 and the insulating layer 320. Accordingly, only one edge 334 of the second thermally conductive layer 330 extends beyond the edges 314 and 324, respectfully, of the first thermally conductive layer 310 and the insulating layer 320.

This arrangement of the heat management structure facilitates cooling of the heat source 302 through heat dissipation along the region of the surface area of the first thermally conductive layer 310 that is adjacent to the atmosphere. This arrangement of the heat management structure also facilitates cooling of the wearer's skin beneath the heat source 302 through heat dissipation along the region of the surface area of the second thermally conductive layer 330 that is adjacent to the atmosphere, which in this case is the region of the surface area of the second thermally conductive layer 330 that is disposed between the edges 314 and 324, respectively, of the first thermally conductive layer 310 and the insulating layer 320 the edge 334 of the second thermally conductive layer 330.

Figure 4:
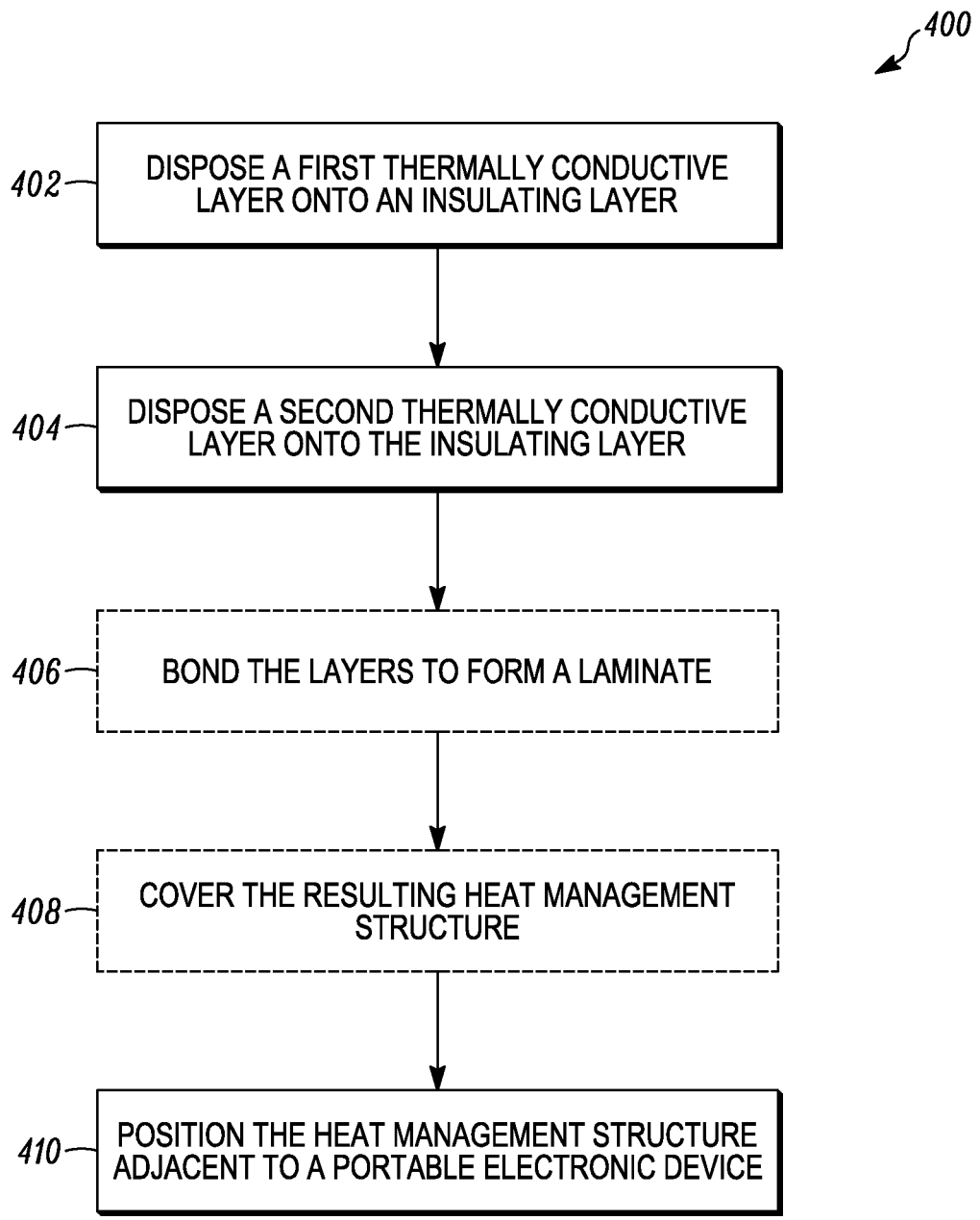
FIG. 4 is a logical flow diagram illustrating a method for manufacturing apparatus having a heat management structure for a wearable electronic device in accordance with an embodiment.

Turning now to FIG. 4, which shows a logical flow diagram 400 illustrating a method for manufacturing apparatus having a heat management structure for a wearable electronic device in accordance with an embodiment. The manufacturing process can utilize any suitable technique for forming and positioning layers of materials including, but not limited to, thin film deposition techniques, where a thin film is a layer or coating of material having a thickness ranging, for example, from fractions of a nanometer to several micrometers.

The process 400 includes disposing 402 a first thermally conductive layer onto a first side of an insulating layer and disposing 404 a second thermally conductive layer onto a second side of the insulating layer such that the first and second thermally conductive layers and the insulating layer are arranged in a stacked configuration along their surface areas. In one embodiment, the first and second thermally conductive layers are constructed from the same material, but this should not be construed as a requirement. Moreover, the thickness of the first and second thermally conductive layers depends at least in part on the material used to fashion these layers. Namely, the thickness of the first and second thermally conductive layers can be decreased with the increase of thermal conductivity associated with the material used to construct these layers. For example, for comparable heat transfer, the thickness of the first and second thermally conductive layers can be at least one hundred times smaller where a material like graphene or graphite is used as opposed to a material like copper or aluminum.

The thickness of the insulating layer and the particular material used to construct the insulating layer can be selected to minimize the heat transfer through the thickness of the heat management structure. Moreover, the heat management structure can be rigid or flexible depending, at least in part, on the materials and manufacturing techniques used to construct the structure and on the particular wearable electronic device into which the structure is incorporated. For example, when using a thin film technology, a flexible and efficient heat management structure can be constructed using material such as graphene and graphite.

In one or more embodiments, at least one edge of the second thermally conductive layer extends beyond an edge of at least one of the first thermally conductive layer or the insulating layer. In one particular embodiment, disposing 402 and 404, respectively, the first and second thermally conductive layers onto the insulating layer includes aligning first edges of the first and second thermally conductive layer and the insulating layer and extending a second edge of the second thermally conductive layer beyond second edges of the first thermally conductive layer and the insulating layer. This embodiment is shown in FIG. 3.

In another embodiment, disposing 402 and 404, respectively, the first and second thermally conductive layers onto the insulating layer includes aligning a center axis of the first and second thermally conductive layers with a center axis of the insulating layer. This embodiment is shown in FIG. 1. In yet another embodiment, disposing 402 and 404, respectively, the first and second thermally conductive layers onto the insulating layer includes aligning a center axis of the first thermally conductive layer with a center axis of the insulating layer, and offsetting a center axis of the second thermally conductive layer from the center axes of the first thermally conductive layer and the insulating layer. This embodiment is shown in FIG. 2. However, other arrangements of disposing 402 and 404, respectively, the first and second thermally conductive layers onto the insulating layer can be envisioned.

The layers of the heat management structure are held or "tied" together such that each layer is directly adjacent to and in physical contact with at least one other layer in the structure. In a particular embodiment, the manufacturing process includes bonding 406 the first and second thermally conductive layers to the insulating layer to form a laminate or composite structure. Any suitable bonding agent or adhesive can be used as depends, for instance, on the materials used to construct the layers of the heat management structure. In alternative implementations, the layers of the heat management structure are held together using other techniques including, but not limited to: pressure from walls of a wearable element that encloses the heat management structure, stitching the layers, etc.

Where the layers of the heat management structure are covered 408, for instance by a wearable element that is attached to the portable electronic device and configured to be worn on a user's body, one or more dimensions of the first and second thermally conductive layers and the insulating layer, e.g., the surface areas and/or thickness, are determined based on availability of space and/or aesthetics of the wearable element. For example, as illustrated in FIGS. 1 and 2, the overall thickness of and surfaces areas of the heat management structure is constrained by the internal volume of the wristband, since the entirety of the heat management structure is contained within the wristband. In any event, whether the heat management structure is disposed completely or partially within a wearable element or coupled to the outside of the wearable element, the relative surface areas of the first and second thermally conductive layers and the insulating layer can be determined by the available real estate space and/or aesthetics, e.g., the look and/or feel to a wearer, of the wearable element.

In accordance with various embodiments, the manufacturing process includes positioning 410 the heat management structure adjacent to a portable electronic device. As mentioned above, the embodiments described herein are applicable for managing heat generated by different types of portable electronic devices such as the watch-like devices illustrated in FIGS. 1 and 2, the computer attached to the eyewear frame illustrated in FIG. 3, and the like.

In the foregoing specification, specific embodiments have been described. However, various modifications and changes can be made without departing from the scope of the embodiments as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that the referenced hardware devices, structures, elements, components, or layers, have a physical arrangement such as by virtue of their size, shape, thickness, material composition, or other physical characteristics and/or physical coupling and/or connectivity with other elements, components, or layers that can enable a particular functionality or feature within a device. A device, structure, element, component, or layer that is "configured" in a certain way is configured in at least that way, but may also be configured in ways that are not described.

The above description refers to features being "connected" or "coupled" together. As used here and, unless expressly stated otherwise, "coupled" means that one feature is directly or indirectly joined to or is in direct or indirect communication with another feature, and not necessarily physically. As used herein, unless expressly stated otherwise, "connected" means that one feature is directly joined to or is in direct communication with another feature. For example, a layer may be "coupled" to a plurality of layers, but all of those layers need not always be "connected" to each other. Furthermore, although the various schematics shown herein depict certain example arrangement of elements, additional intervening elements, devices, features, or components may be present in an actual embodiment, assuming that the functionality of the given device is not adversely affected.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A heat management structure comprising:
   a first thermally conductive layer;
   a second thermally conductive layer; and
   an insulating layer, wherein the first and second thermally conductive layers and the insulating layer are arranged in a stacked configuration along surface areas of the first and second thermally conductive layers and the insulating layer with the insulating layer disposed between and in physical contact with the first and second thermally conductive layers, wherein the second thermally conductive layer extends beyond edges of at least one of the first thermally conductive layer or the insulating layer, and wherein the second thermally conductive layer is configured to a shape of a body part.

2. The heat management structure of claim 1, wherein the surface areas of the first and second thermally conductive layers and the insulating layer are determined based on at least one of availability of space or aesthetics of a wearable element covering the heat management structure and to which a portable electronic device is attached.

3. The heat management structure of claim 1, wherein the surface areas of the first thermally conductive layer and the insulating layer are substantially the same, and the surface area of the second conductive layer is larger than the surface areas of the first thermally conductive layer and the insulating layer.

4. The heat management structure of claim 3, wherein a first edge of the second thermally conductive layer extends beyond first edges of the first thermally conductive layer and the insulating layer, and a second edge of the second thermally conductive layer extends beyond second edges of the first thermally conductive layer and the insulating layer.

5. The heat management structure of claim 4, wherein a central portion of the surface areas of the first and second thermally conductive layers and the insulating layer are aligned about a central axis through the stacked configuration.

6. The heat management structure of claim 3, wherein a first edge of the second thermally conductive layer extends beyond first edges of the first thermally conductive layer and the insulating layer, and a second edge of the second thermally conductive layer is coincident with second edges of the first thermally conductive layer and the insulating layer.

7. The heat management structure of claim 1, wherein a central portion of the surface areas of the first thermally conductive layer and the insulating layer are offset to one side of a central axis through the stacked configuration, and a central portion of the surface area of the second thermally conductive layer is offset to an opposite side of the central axis through the stacked configuration.

8. The heat management structure of claim 7, wherein the surface areas of the first and second thermally conductive layers and the insulating layer are substantially the same.

9. The heat management structure of claim 1, wherein the first and second thermally conductive layers and the insulating layer are bonded to form a laminate.

10. A wearable electronic device comprising:
    a portable electronic device;
    a wearable element configured to be worn on a body part; and
    a heat management structure coupled to the portable electronic device, the heat management structure being disposed within and covered by the wearable element, the heat management structure comprising:

a first thermally conductive layer disposed adjacent to the portable electronic device;

a second thermally conductive layer; and an insulating layer disposed between and in physical contact with the first and second thermally conductive layers, wherein the first and second thermally conductive layers and the insulating layer are arranged in a stacked configuration along surface areas of the first and second thermally conductive layers and the insulating layer, wherein the second thermally conductive layer extends beyond edges of at least one of the first thermally conductive layer or the insulating layer, and wherein the second thermally conductive layer is configured to a shape of the body part.

11. The wearable electronic device of claim 10, wherein a first edge of the second thermally conductive layer extends beyond first edges of the first thermally conductive layer and the insulating layer, and a second edge of the second thermally conductive layer is coincident with second edges of the first thermally conductive layer and the insulating layer.

12. The wearable electronic device of claim 10, wherein a first edge of the second thermally conductive layer extends beyond first edges of the first thermally conductive layer and the insulating layer, and a second edge of the second thermally conductive layer extends beyond second edges of the first thermally conductive layer and the insulating layer, and wherein a central portion of the surface areas of the first and second thermally conductive layers and the insulating layer are aligned about a central axis through the stacked configuration.

13. The wearable electronic device of claim 10, wherein a central portion of the surface areas of the first thermally conductive layer and the insulating layer are offset to one side of a central axis through the stacked configuration, and a central portion of the surface area of the second thermally conductive layer is offset to an opposite side of the central axis through the stacked configuration.

14. The wearable electronic device of claim 10, wherein the wearable element is attached to the portable electronic device.

15. A method for manufacturing a heat management structure, the method comprising:

disposing a first thermally conductive layer onto a first side of an insulating layer; and disposing a second thermally conductive layer onto a second side of the insulating layer, wherein the first and second thermally conductive layers and the insulating layer are arranged in a stacked configuration along surface areas of the first and second thermally conductive layers and the insulating layer, wherein the second thermally conductive layer extends beyond edges of at least one of the first thermally conductive layer or the insulating layer, and wherein the second thermally conductive layer is configured to a shape of a body part.

16. The method of claim 15, wherein disposing the first and second thermally conductive layers onto the insulating layer comprises aligning first edges of the first and second thermally conductive layer and the insulating layer, and extending a second edge of the second thermally conductive layer beyond second edges of the first thermally conductive layer and the insulating layer.

17. The method of claim 15, wherein disposing the first and second thermally conductive layers onto the insulating layer comprises aligning a center axis of the first and second thermally conductive layers with a center axis of the insulating layer.

18. The method of claim 15, wherein disposing the first and second thermally conductive layers onto the insulating layer comprises aligning a center axis of the first thermally conductive layer with a center axis of the insulating layer, and offsetting a center axis of the second thermally conductive layer from the center axes of the first thermally conductive layer and the insulating layer.

19. The method of claim 15 further comprising positioning the heat management structure adjacent to a portable electronic device.

\* \* \* \* \*